United States Patent [19]
Suzuki et al.

[11] Patent Number: 5,417,542
[45] Date of Patent: May 23, 1995

[54] METHOD AND APPARATUS FOR CARRYING WORKPIECE BY CONTINUOUS WORKPIECE CARRYING OPERATION

[75] Inventors: Hisao Suzuki; Kazuhiro Tokitsu; Makoto Kasahara; Kiyoe Imai; Kouichi Yumita; Tadashi Munakata; Yoshinobu Ishikawa, all of Tokyo; Etuo Minamihama, Mieken; Takatomo Izume, Saitamaken; Yasuharu Ujiie, Tokyo; Masamichi Kato, Mieken, all of Japan

[73] Assignees: Japan Tobacco; Kabushiki Kaisha Toshiba, both of Tokyo, Japan

[21] Appl. No.: 950,715

[22] Filed: Sep. 25, 1992

[30] Foreign Application Priority Data

Sep. 25, 1991 [JP] Japan .................. 3-246226
Sep. 25, 1991 [JP] Japan .................. 3-246229
Sep. 25, 1991 [JP] Japan .................. 3-246230
Sep. 25, 1991 [JP] Japan .................. 3-246239
Sep. 25, 1991 [JP] Japan .................. 3-246240

[51] Int. Cl.6 ........................... B65G 25/00
[52] U.S. Cl. ..................... 414/752; 414/737; 414/225; 414/786
[58] Field of Search ......... 414/736, 737, 223, 225, 414/749, 750, 752, 786

[56] References Cited

U.S. PATENT DOCUMENTS

| 4,372,802 | 2/1983 | Harigane et al. | 414/750 X |
| 4,626,167 | 12/1986 | Bond et al. | 414/223 X |
| 5,234,304 | 8/1993 | Okumoto et al. | 414/225 |

FOREIGN PATENT DOCUMENTS 0315799 5/1989 European Pat. Off. .
0371205 6/1990 European Pat. Off. .

Primary Examiner—Donald W. Underwood
Attorney, Agent, or Firm—Oblon, Spivak, McClelland, Maier & Neustadt

[57] ABSTRACT

A method and an apparatus for carrying a workpiece for improving efficiency in a workpiece carrying operation. In the apparatus, a moving member having a workpiece holding member is driven with a linear motion in a horizontal plane along a carrier passage, and the workpiece holding member is driven with a revolutional motion in a vertical plane around a revolution axis displaced from a center of the workpiece holding member, while the workpiece holding member maintains an orientation in which a holder holding the workpiece points downwards. The holder of the workpiece holding member is controlled to sequentially carry out holding of the workpiece and releasing of the workpiece at lowest positions of the workpiece holding member in the revolutional motion, so as to realize a continuous workpiece carrying operation.

20 Claims, 11 Drawing Sheets

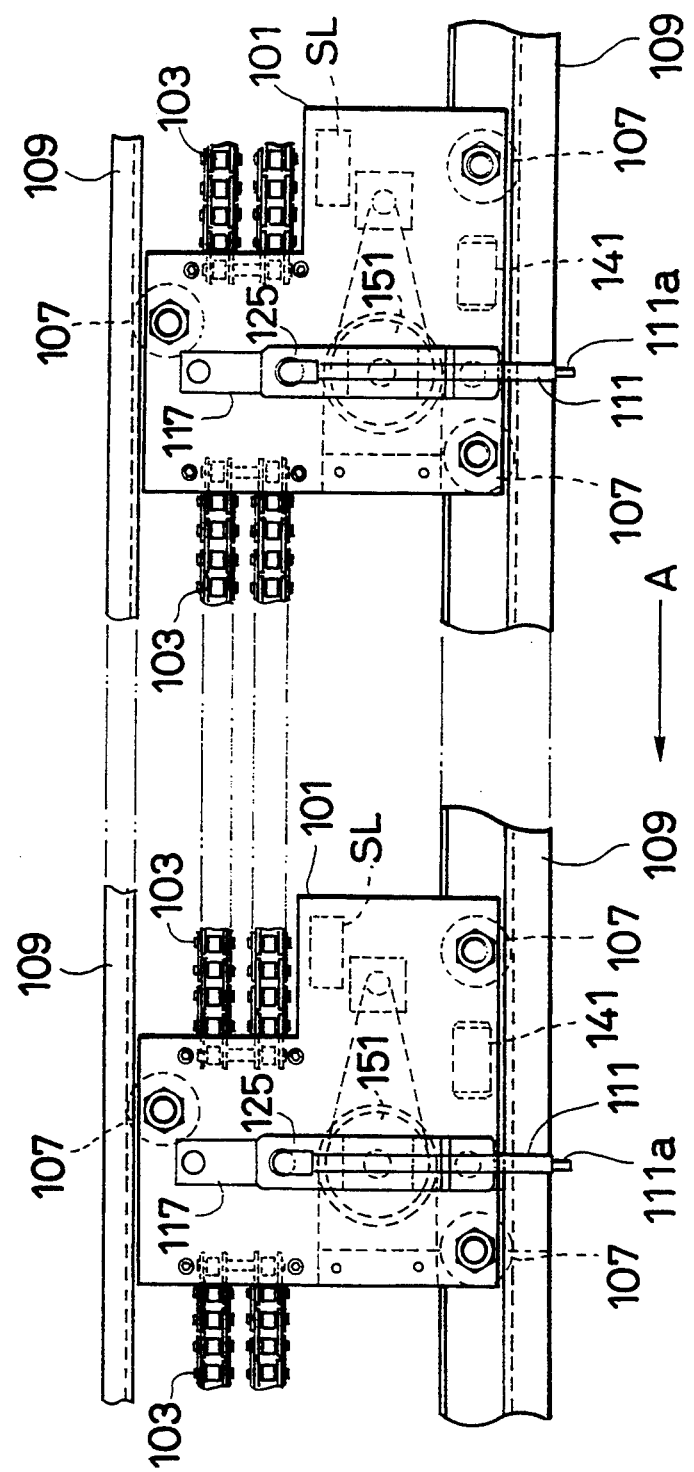

METHOD AND APPARATUS FOR CARRYING WORKPIECE BY CONTINUOUS WORKPIECE CARRYING OPERATION

BACKGROUND OF THE INVENTION

1. Field of the Invention

The present invention relates to a method and an apparatus for carrying a workpiece from one place to another.

2. Description of the Background Art

Conventionally, there have been various types of apparatuses for carrying a relatively small workpiece such as a semiconductor chip by picking up the workpiece at a supply station and carrying it over to a prescribed position for the next manufacturing step.

For instance, as an example of an apparatus which carries the workpiece while holding it and releases the workpiece at a prescribed position, there is that which is disclosed in Japanese Patent Application Laid Open No. 62-114290.

In this conventional apparatus for carrying workpiece, a vertically movable suction head provided on a circumference of a rotatable table is lowered at a suction station after the table is stopped there, and then raised after the workpiece such as a chip is sucked. Then, the table is rotated for a prescribed angle to reach an installation station while the workpiece is sucked by the suction head. Then, the suction head is lowered and the workpiece is released at the installation station after the table is stopped there, so as to install the chip on a printed substrate placed at the installation station, and thereafter the same operation is repeated.

However, such a conventional apparatus for carrying workpiece has a drawback in that the rotation of the table must be stopped at a time of picking up the workpiece by the suction head and at the time of the releasing the workpiece from the suction head so that the rotatable table is required to carry out an intermittent rotational motion, which inevitably incorporates time losses during stopping of the rotatable table and is therefore less preferable from a point of view of the efficiency in the workpiece carrying operation.

Moreover, such a conventional apparatus for carrying a workpiece is a highly specialized apparatus in which the carrier passage for the workpiece is limited on the circumference of the rotatable table, so that applicability of the apparatus is severely limited.

In addition, in such a conventional apparatus for carrying a workpiece, the workpieces to be carried by the apparatus are required to have the identical size. Although this drawback can be partially resolved by changing the suction head according to the size of the workpieces to be carried, it is still impossible to deal with workpieces of mixed sizes.

Furthermore, in such a conventional apparatus for carrying a workpiece, it becomes impossible to achieve proper installation of the workpiece with a correct orientation when the workpiece is picked up by being sucked by the suction head at the suction station in an incorrect orientation deviating from a correct one.

SUMMARY OF THE INVENTION

It is therefore an object of the present invention to provide a method and an apparatus for carrying workpiece, capable of improving the efficiency of a workpiece carrying operation.

It is another object of the present invention to provide a method and an apparatus for carrying a workpiece which are capable of dealing with any type of workpiece of any size.

It is another object of the present invention to provide a method and an apparatus for carrying a workpiece which are capable of realizing proper installation of each workpiece in a correct orientation.

It is another object of the present invention to provide a method and an apparatus for carrying a workpiece which are capable of realizing a continuous workpiece carrying operation.

It is another object of the present invention to provide a method and an apparatus for carrying a workpiece which are capable of appropriately adjusting the period of time between being located at a position for picking up the workpiece and a position for releasing the workpiece.

It is another object of the present invention to provide a method and apparatus for carrying a workpiece, in which a carrier passage of the workpiece is not limited to a specific carrier passage.

According to one aspect of the present invention there is provided an apparatus for carrying a workpiece, comprising: guide members forming a carrier passage; a moving member linearly movable in a horizontal plane along the guide members; a workpiece holding member, provided on the moving member, having at least one holder for holding the workpiece, and capable of revolving in a vertical plane around an axis of revolution displaced from a center of the workpiece holding member; a driving mechanism for driving the workpiece holding member in a revolutional motion on the vertical plane around the revolution axis, while the workpiece holding member maintains an orientation in which the holder holding the workpiece points downwards; and a control mechanism for controlling the holder to sequentially carry out holding of the workpiece and releasing of the workpiece at the lowest positions of the workpiece holding member in the revolutional motion.

According to another aspect of the present invention there is provided a method of carrying a workpiece, comprising the steps of: holding the workpiece by at least one holder provided on a workpiece holding member; driving a moving member, on which the workpiece holding member is provided, in a linear motion in a horizontal plane along a carrier passage formed by guide members; driving the workpiece holding member in a revolutional motion in a vertical plane around a revolution axis displaced from a center of the workpiece holding member, while the workpiece holding member maintains an orientation in which at least one holder holding the workpiece so as to be pointed downwards; and controlling the holder to sequentially carry out a holding of the workpiece and a releasing of the workpiece at the lowest positions of the workpiece holding member in the revolutional motion.

Other features and advantages of the present invention will become apparent from the following description when taken in conjunction with the accompanying drawings.

BRIEF DESCRIPTION OF THE DRAWINGS

FIG. 13 is a schematic side view of the apparatus of FIG. 11 for explaining its overall operation.

DESCRIPTION OF THE PREFERRED EMBODIMENTS

Referring now to FIG. 1 to FIG. 10, a first embodiment of an apparatus for carrying a workpiece according to the present invention will be described in detail.

Figure 1:
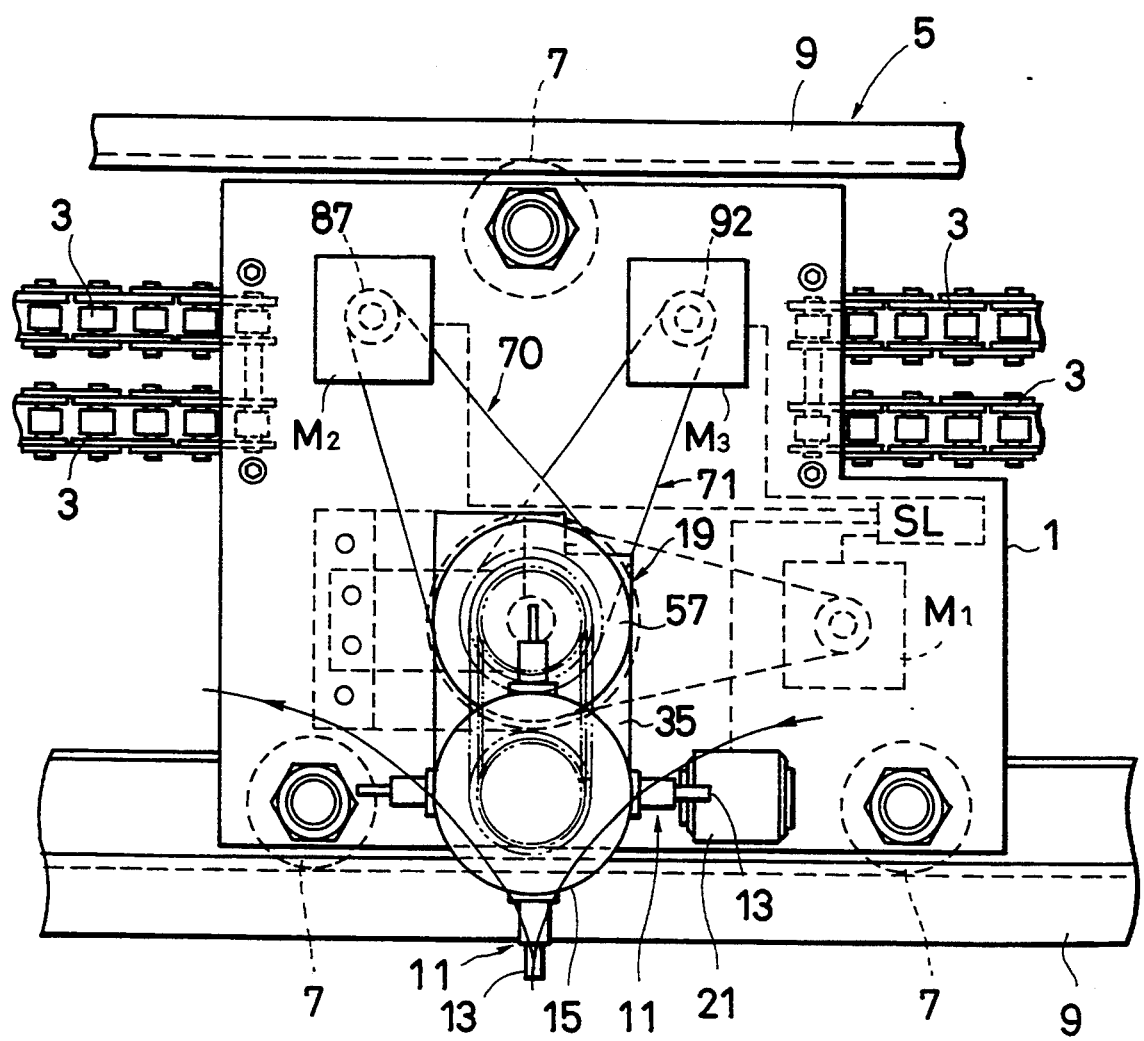
FIG. 1 is a schematic side view of a first embodiment of an apparatus for carrying a workpiece according to the present invention.

As shown in FIG. 1, in this first embodiment, the apparatus 5 generally comprises: a pair of guide rails 9 forming a carrier passage; a plate shaped moving member 1 provided between upper and lower members of the guide rails 9 to be linearly movable on a horizontal plane along the guide rails 9 by means of rollers 7; and a chain 3 for driving the movable member 1 in a linear motion along the guide rails 9. The apparatus 5 can be equipped with a plurality of the moving members 1 similar to that shown in FIG. 1 along the carrier passage formed by the guide rails 9.

The movable member 1 is equipped with a workpiece holding member 11 which comprises a rotary head 15 and four suction nozzles 13 of different sizes capable of holding the workpiece, which are arranged around the circumference of the rotary head 15 with 90 degrees interval between adjacent ones, and extending radially from the rotary head 15. The workpiece holding member 11 is capable of revolving on a vertical plane around a revolution axis displaced from a center of the workpiece holding member 11, by means of a transmission control mechanism provided in the moving member 1, which will be described in detail below.

Figure 2:
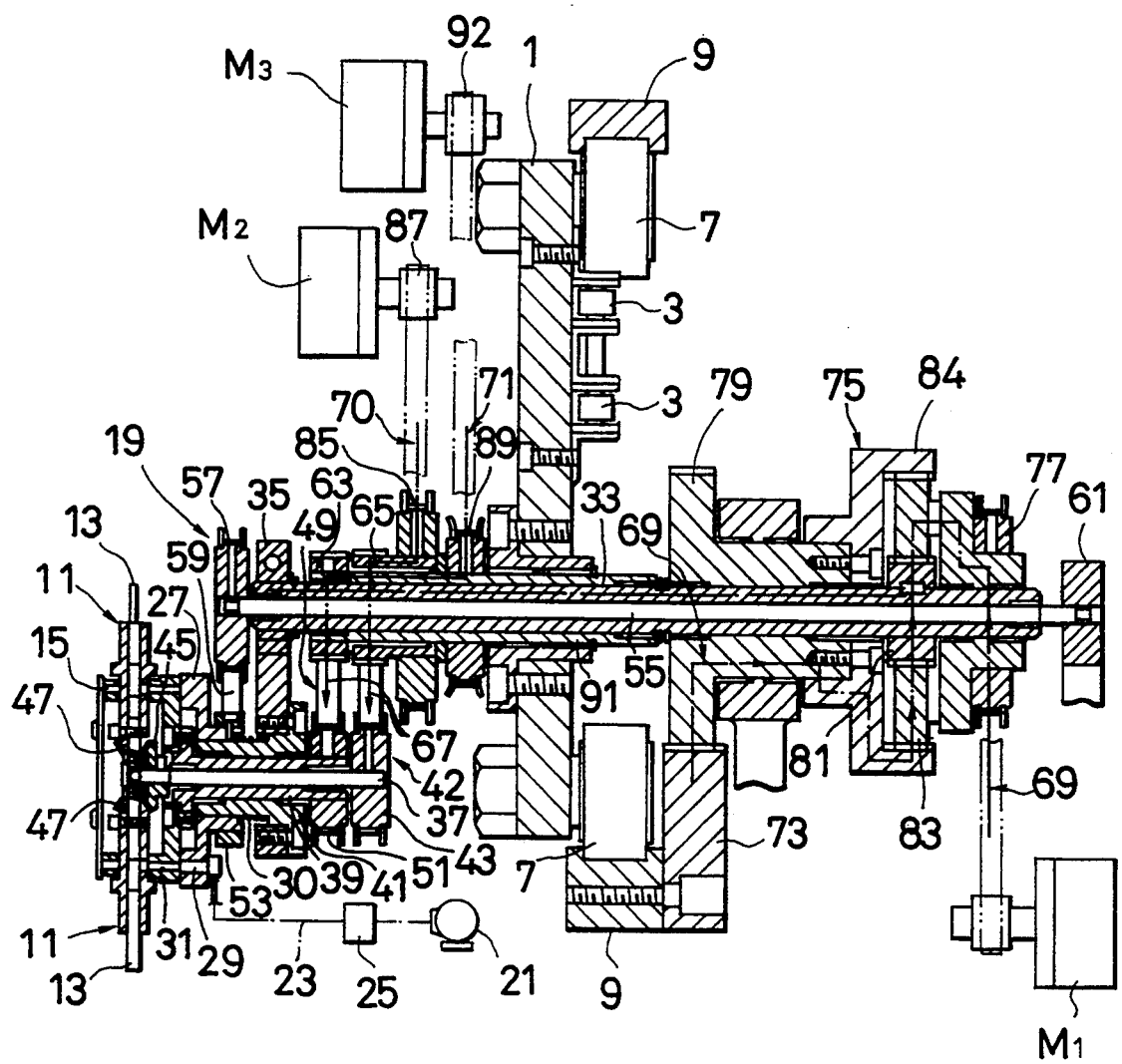
FIG. 2 is a detailed cross sectional view of a main portion of the apparatus of FIG. 1.

As shown in further detail in FIG. 2, the suction nozzles 13 are connected to a vacuum pump 21 through a pipe 23, such that the holding and releasing of the workpieces by the suction nozzles 13 can be controlled by means of a valve 25 provided on the pipe 23.

The pipe 23 and the valve 25 are movable along the moving member 1, and one end of the pipe 23 is connected to a connection hole 29 on a disk member 27 which is pressed against a back side of the rotary head 15 by means of a spring 30. The connection hole 29 is provided at a position facing against a connection path 31, provided inside the rotary head 15 in correspondence to each of the suction nozzles 13, for connecting the connection hole 29 and one of the suction nozzles 13, whenever the rotary head 15 is rotated by 90 degrees.

Also as shown in detail in FIG. 2, the transmission control mechanism 19 for driving the workpiece holding member 11 generally comprises a sleeve shaft 33 defining the revolution axis, a link 35 fixed to the sleeve shaft 33, and first, second, and third shafts 37, 39, and 41 connected to the workpiece holding member 11 which are driven into a revolving motion around the revolution axis along with the workpiece holding member 11 by means of the link 35.

Figure 3:
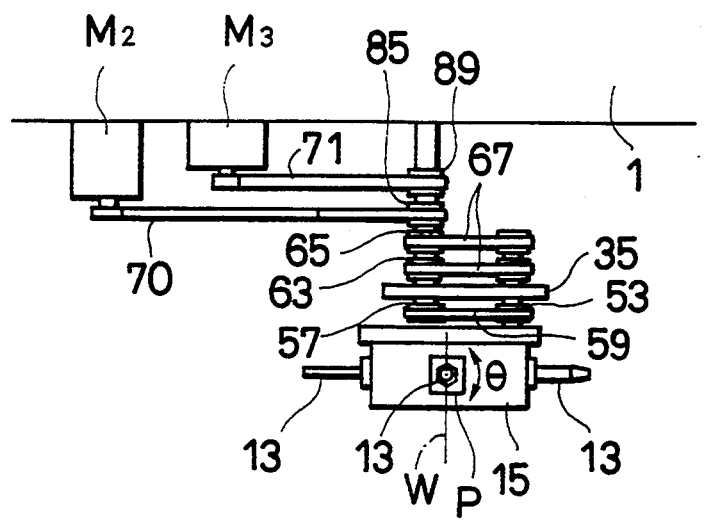
FIG. 3 is a detailed side view of a rotary head of the apparatus of FIG. 1.

The first shaft 37 is a transmission system for a suction nozzle rotation control mechanism 42, and provided within the second shaft 39 so as to be freely rotatable. One end of the first shaft 37 is attached to a suction nozzle driving pulley 43, while the other end of the first shaft 37 is attached to a side gear 45, where the side gear 45 is engaged with a pinion gear 47 attached to a base portion of the suction nozzles 13. Thus, when the suction nozzle driving pulley 43 is driven into a rotational motion, the first shaft 37 is rotated and the rotation of the first shaft 37 is transmitted through the side gear 45 and the pinion gear 47 and each of the suction nozzles 13 rotates around itself, as shown in FIG. 3, in a $\theta$ direction, such that the orientation of the workpiece P held by each of the suction nozzles 13 with respect to a reference line W can be properly adjusted by appropriately rotating each of the suction nozzles 13 around itself in the $\theta$ direction.

The second shaft 39 is a transmission system for a suction nozzle selection control mechanism 49, and is provided within the third shaft 41 so as to be freely rotatable. One end of the second shaft 39 is attached to the rotary head 15, while the other end of the second shaft 39 is attached to a rotary head driving pulley 51. Thus, when the rotary head driving pulley 51 is driven into a rotational motion, the second shaft 39 is rotated and the rotation of the second shaft 39 is transmitted to the rotary head 15, such that the appropriate one of the suction nozzles 13 can be selected to be pointing downwards by appropriately rotating the rotary head 15.

The third shaft 41 is a transmission system for the transmission control mechanism 19. One end of the third shaft 41 is attached to the link 35, while the other end of the third shaft 41 is attached to a base portion of the disk member 27 to be freely rotatable, where the base portion of the disk member 27 is equipped with a pulley 53. The pulley 53 is connected through a belt 59 with a terminal pulley 57 fixedly attached at one end of a fixed shaft 55 housed inside the sleeve shaft 33, while the other end of the fixed shaft 55 is fixedly supported by a bracket 61 provided on the moving member 1.

The suction nozzle driving pulley 43 and the rotary head driving pulley 51 are connected through belts 67 with terminal pulleys 63 and 65 of second and third transmission paths 70 and 71, respectively, to be described in detail below.

Thus, while the terminal pulleys 63 and 65 are stopping, when the link 35 is driven into a rotational motion by a driving force transmitted by a first transmission path 69 to be described in detail below, a planetary gear mechanism in which the rotary head 15 rotates around itself while revolving around the revolution axis is realized.

The pulley ratio for each of the pairs of the pulleys 43 and 65, 51 and 63, and 53 and 57 is set to be equal to 1:1.

Figure 4:
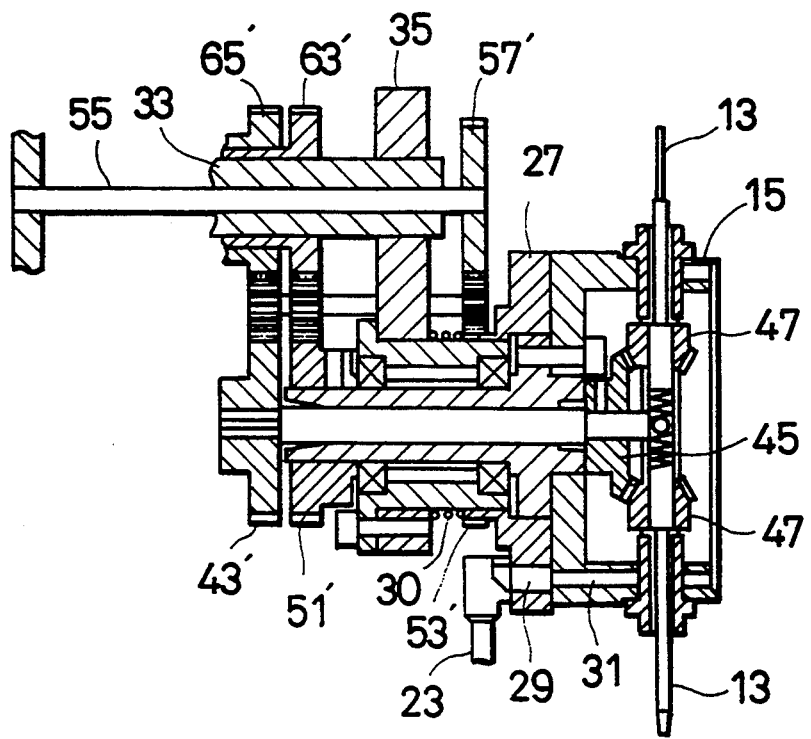
FIG. 4 is a detailed cross sectional view of an alternative configuration of the main portion of the apparatus of FIG. 1.

Here, it is to be noted that, in this planetary gear mechanism, the connections between the pairs of the pulleys 43 and 65, 51 and 63, and 53 and 57 using a belt transmission made by the belts 59 and 67 described above may be replaced by connections using a gear transmission made by pairs of engaged gears 43' and 65', 51' and 63', and 53' and 57', as shown in FIG. 4.

Thus, in this first embodiment, by means of this planetary gear mechanism, it is possible for the rotary head 15 of the workpiece holding member 11 to make the revolutional motion around the revolution axis defined by the sleeve shaft 33 while maintaining an orientation in which one of the suction nozzles 13 points downwards.

The first transmission path 69 is a transmission system to which a driving Force produced by a first motor M1 provided on the moving member 1 and a driving force from a rack 78 provided along the guide rails 9 are entered simultaneously through a differential gear 75.

The differential gear 75 is what is generally known as a harmonic gear, which has two transmission mechanisms including a motor transmission mechanism for transmitting the driving force from the first motor M1 to an input pulley 77, and a rack transmission mechanism for transmitting the driving force from the rack 73 to the sleeve shaft 33 as a transmission gear 79 is rotated around itself by the rack 73 in response to the linear motion of the moving member 1.

The input pulley 77 is attached to a planetary gear 83 which rotates around a solar gear 81 while rotating around itself, where the planetary gear 83 is engaged between the solar gear 81 and a ring gear 84 which is fixed to the transmission gear 79 integrally.

Figure 5:
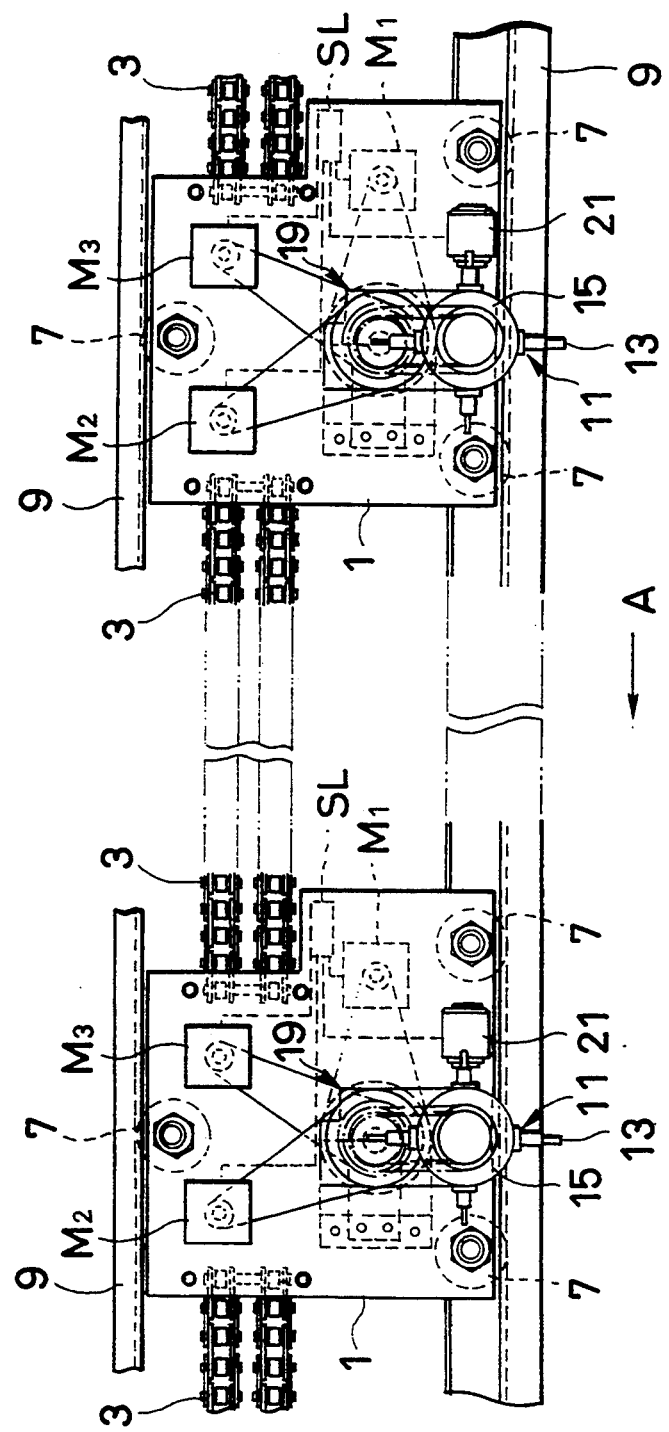
FIG. 5 is a schematic side view of the apparatus of FIG. 1 for explaining its overall operation.

Thus, while the first motor M1 is off, as the moving member 1 linearly moves in the direction of an arrow A shown in FIG. 5, the transmission gear 79 engaged with the rack 73 rotates around itself, and the rotational driving force of the transmission gear 79 is transmitted to the sleeve shaft 33 through the differential gear 75 as a rotational driving force in a counter-clockwise direction.

Figure 6:
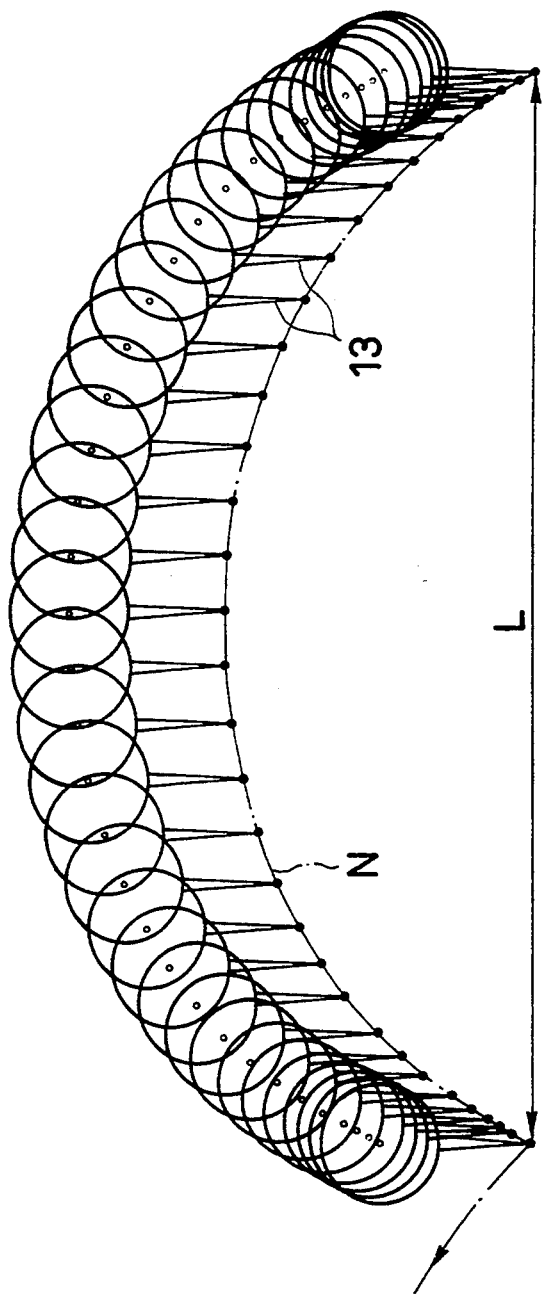
FIG. 6 is a diagram of a cycloidal trajectory of a tip of the suction nozzle for holding the workpiece in the apparatus of FIG. 1.

As a result of a combination of the planetary gear mechanism for the workpiece holding member 11 described above and the first transmission path 69, the tip of each of the suction nozzles 13 repeats a pick up motion along a cycloidal trajectory N as shown in FIG. 6.

On the other hand, during this pick up motion of the suction nozzles 13, the period L of the cycloidal trajectory N for the pick up motion can be adjusted, to be longer or shorter as desired, by rotating the input pulley 77 in the same direction as the linear motion of the moving member 1, using the driving force produced by the first motor M1.

More specifically, this adjustment of the period of the pick up motion can be made as follows. Namely, when the transmission gear 79 rotates once while the input pulley 77 is stopping, the rotation of the transmission gear 79 is transmitted through the planetary gear 83 to the solar gear 81 as a rotation in an opposite direction. At this point, by rotating the planetary gear 83 around the solar gear 81 in the same direction as the rotation of the transmission gear 79 by using the first motor M1, the suction nozzles 13 can be put in the pick up motion along the cycloidal trajectory N with the period L corresponding to the gear ratio of the transmission gear 79. In this pick up motion, the ratio of rotations is set to be such that the speed of the tip of each of the suction nozzles 13 due to the linear motion of the moving member 1 in the direction of an arrow A shown in FIG. 5 can be cancelled out by the speed of the tip of each of the suction nozzles 13 due to the revolutional motion of the workpiece holding member 11, so that one of the suction nozzles 13 holding the workpiece, which is maintained to be pointing downwards throughout the pick up motion, can make the stable pick up or releasing operation with respect to the workpiece as its tip has the speed with respect to the ground substantially equal to zero at the lowest position of the workpiece holding member 11 in the revolutional motion. Thus, by properly controlling the rotation of the planetary gear 83 around the solar gear 81 by using the first motor M1, the period L of the cycloidal trajectory N for the pick up motion can be adjusted appropriately.

Furthermore, by controlling the rotation of the planetary gear 83 around the solar gear 81 such that the rotation of the planetary gear 83 is completely synchronized with the rotation of the transmission gear 81, the rotary head 15 can revolve around the revolution axis without rotating around itself.

The second transmission path 70 is a transmission system for the above described θ angle correction of the suction nozzles 13, in which the driving force produced by the second motor M2 provided on the moving member 1 is entered through an input pulley 85 into the suction nozzle driving pulley 43. The input pulley 85 is fixed to the base portion of the terminal pulley 65, and the connected with a motor pulley 87 associated with the second motor M2 through a belt transmission.

The third transmission path 71 is a transmission system for the above described selection of the suction nozzles 13, in which the driving force produced by the third motor M3 provided on the moving member 1 is entered through an input pulley 89 into the rotary head driving pulley 51. The input pulley 89 is fixed to a sleeve portion 91 of the terminal pulley 63, and connected with a motor pulley 92 associated with the third motor M3 through a belt transmission. By means of this third transmission path 71, the selection of an appropriate one of the suction nozzles 13 can be made by rotating the rotary head 15 appropriately.

This apparatus 5 of the first embodiment is further equipped with a control unit SL provided on the moving member 1, as shown in FIG. 1. This control unit SL receives various input information from various sensors (not shown) provided in the apparatus 5 such as an image recognition sensor for confirming a state of holding of the workpiece by the suction nozzles 13, a distance sensor for measuring a distance traveled by the moving member 1, etc. Using this various input information, the control unit SL outputs control signals for appropriately controlling opening and closing timing for the valve 25, and on and off timing for the first, second, and third motors M1, M2, and M3.

Now, an overall operation of this apparatus for carrying a workpiece of the first embodiment will be described.

Namely, the moving member 1 linearly moves continuously, and the workpiece holding member 11 continuously makes a revolutional motion around the revolution axis while maintaining a selected one of the suction nozzles 13 pointing downwards. As a result, the selected one of the suction nozzles 13 makes the pick up motion along the cycloidal trajectory N of the period L between the successive lowermost positions. In this pick up motion, the tip of the selected one of the suction nozzles 13 has the speed with respect to the ground substantially equal to zero at the lowermost positions, so that a stable pick up or releasing operation can be made with respect to the workpiece at the ground level.

Here, in this pick up motion, no intermittent motion is involved so that there is no time loss in the workpiece carrying operation and a continuous workpiece carrying operation can be realized.

Moreover, by appropriately adjusting the period L of the cycloidal trajectory N for this pick up motion, the workpiece carrying operation involving any desired pick up and releasing position can be realized, so that the efficiency of the workpiece carrying operation can be improved.

In addition, by providing a plurality of the suction nozzles 13 in different sizes, and selecting an appropriate one by rotating the rotary head 15, it becomes possible to deal with any type of workpieces in any size.

Furthermore, by making the $\theta$ angle correction using the rotation of each of the suction nozzles 13 around itself, it becomes possible to achieve a proper installation of each workpiece with a correct orientation.

It is to be noted that the apparatus for carrying a workpiece of the first embodiment described above may be modified as follows.

Namely, the connection hole 29 on the disk member 27 may be formed to be facing against the connection path 31 of the rotary head 15 such that the vacuum suction force transmitted through the connection hole 29 can be transmitted to one of the suction nozzles 13 until the rotary head 15 is rotated by 45 degrees from a position at which that one of the suction nozzles 13 is pointing downwards.

Figure 7:
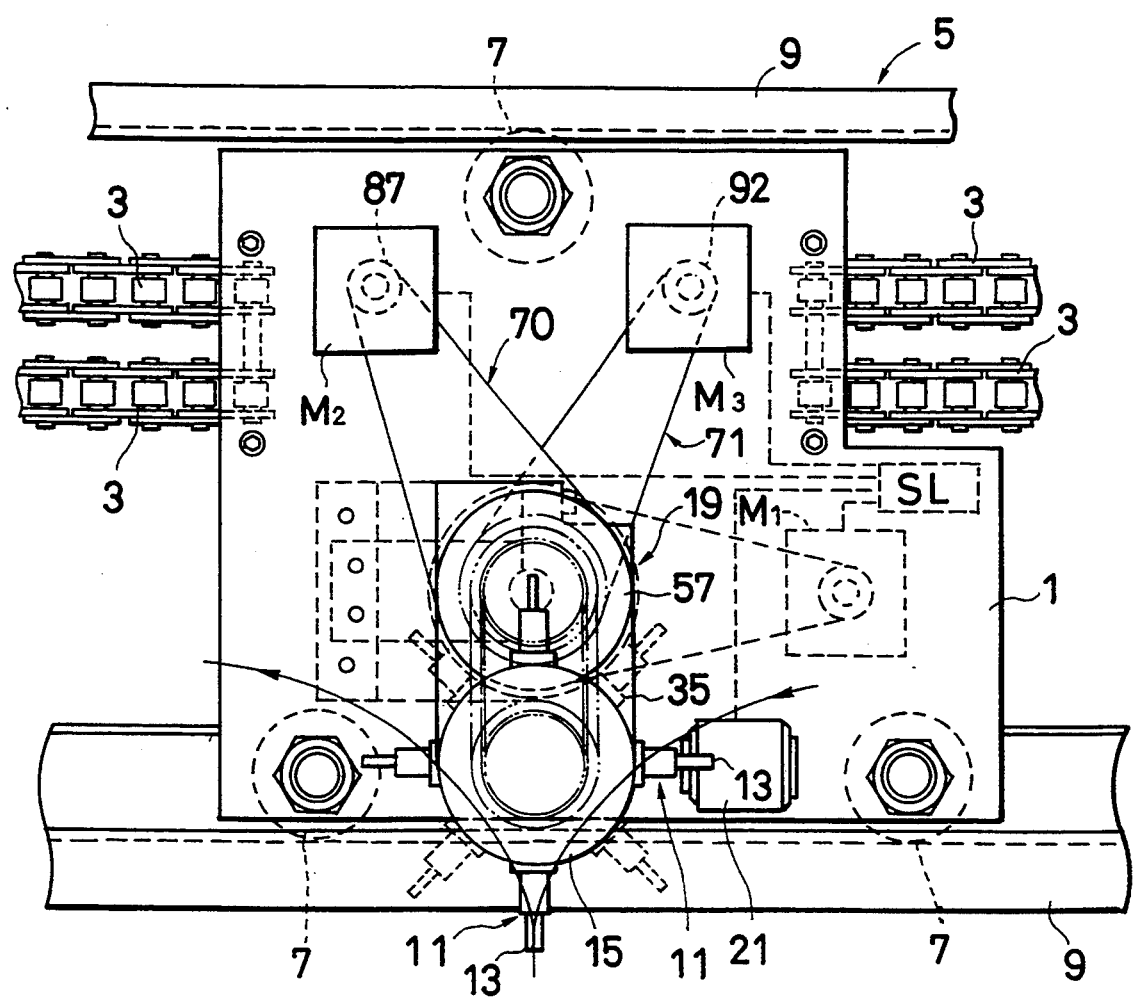
FIG. 7 is a schematic side view of the apparatus of FIG. 1 for explaining one aspect of its operation.
Figure 8:
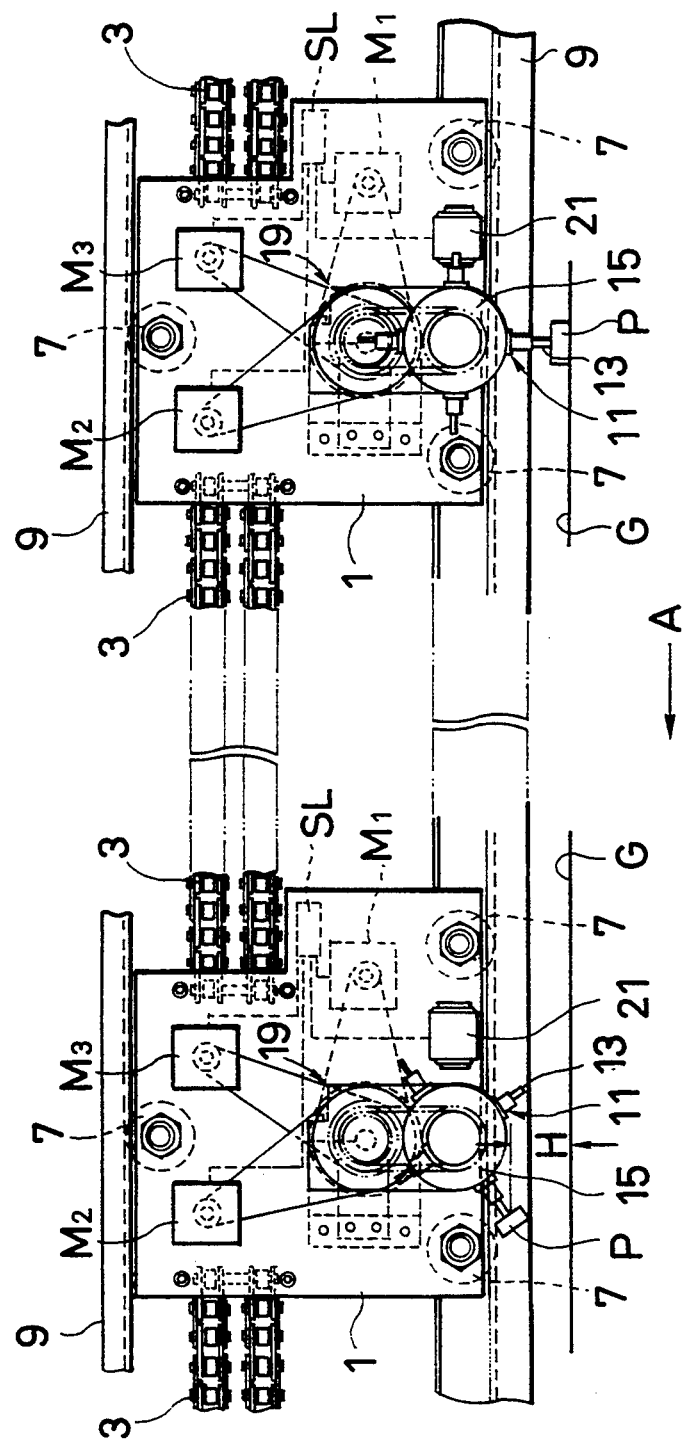
FIG. 8 is a schematic side view of the apparatus of FIG. 1 for explaining one aspect of its overall operation.

With this configuration of the connection hole 29, when the rotary head driving pulley 51 is driven into a rotational motion to rotate the rotary head 15 by 45 degrees, as shown in FIG. 7, the workpiece P held by one of the suction nozzles 13 while that suction nozzle is pointing straight downwards can be raised above the ground level G for a predetermined height H while still being held by that suction nozzle, as shown in FIG. 8, so that the possible interference between the workpiece P and the ground G during the pick up motion along the cycloidal trajectory for carrying the workpiece can be prevented even at the lowest positions of the workpiece holding member 11 in the revolutional motion.

Figure 9:
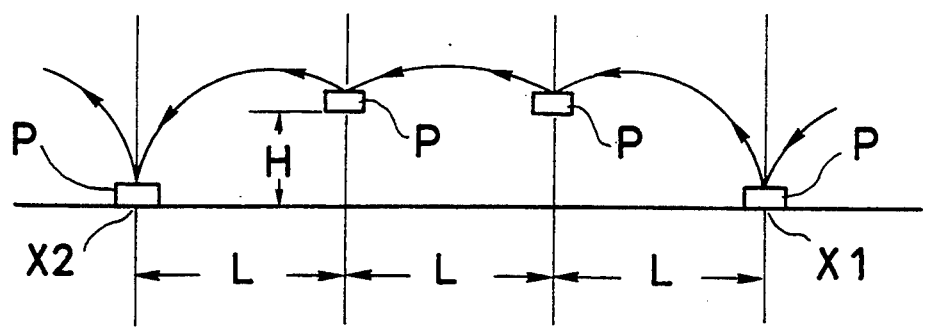
FIG. 9 is a diagram of one possible trajectory of the workpiece carried by the apparatus of FIG. 1.

Consequently, as shown in FIG. 9, it becomes possible to realize the trajectory for carrying the workpiece, in which after the workpiece P is picked up at the position X1 at the ground level, the subsequent pick up motions until the workpiece P is released at the position X2 at the ground level can be made along the cycloidal trajectory in which the lowermost positions of the suction nozzles 13 is raised above the ground level by the predetermined height H, such that the workpiece P can be carried safely between the pick up position X1 and the releasing position X2.

Figure 10:
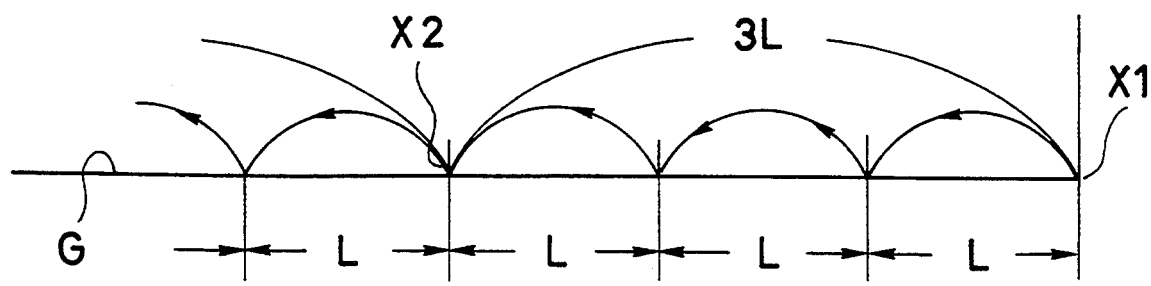
FIG. 10 is a diagram of another possible trajectory of the workpiece carried by the apparatus of FIG. 1.

It is also to be noted that in the apparatus for carrying a workpiece of the first embodiment described above, the period of the cycloidal trajectory can be adjusted to cover the distance between the pick up position X1 and the releasing position X2 by one cycle, as shown in FIG. 10, where the distance between the pick up position X1 and the releasing position X2 is three times the periods L, so that in such a case, instead of repeating the pick up motion along the shorter cycloidal trajectory with the period L for three times, the pick up motion can be made along the longer cycloidal trajectory with the period 3L.

With this provision, the workpiece can be also carried safely as the possible interference between the workpiece P and the ground during the pick up motion along the cycloidal trajectory for carrying the workpiece can be prevented, because the workpiece P comes near to the ground level only at the lowest positions of the workpiece holding member 11 in the revolutional motion located at the pick up position X1 and the releasing position X2. As a consequence, there is no need to impose any limitation on the carrier passage for carrying the workpiece.

It is also to be noted that the vacuum suction at the suction nozzles 13 used in the embodiment described above for the purpose of holding the workpiece can be replaced by any other holding means such as those using electromagnets, fasteners, etc.

It is also to be noted that the guide rails 9 used in the embodiment described above for the purpose of guiding the moving member 1 along the desired carrier passage can be replaced by a built-in direction and speed control means provided on the moving member 1 itself for controlling the linear motion of the moving member 1.

Figure 11:
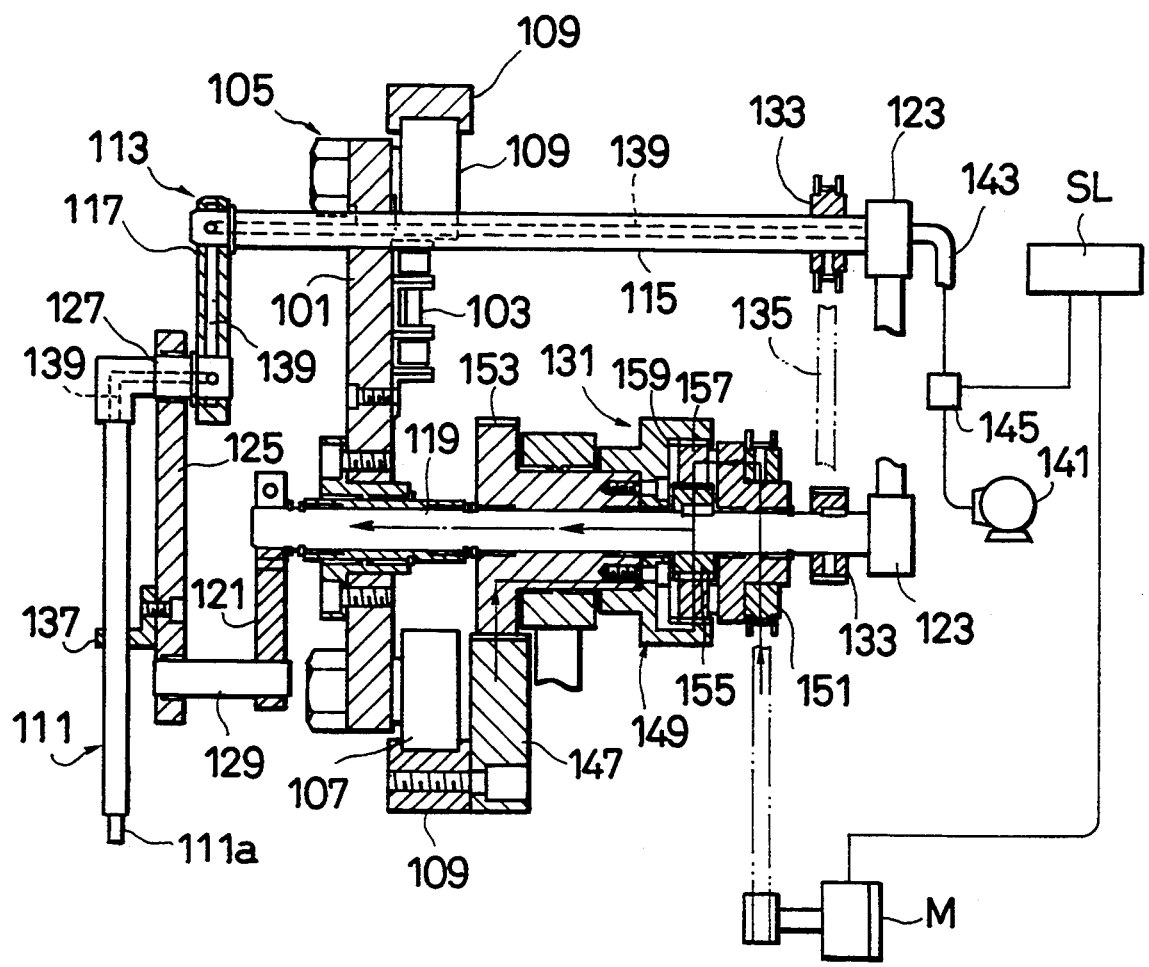
FIG. 11 is a detailed cross sectional view of a main portion of a second embodiment of an apparatus for carrying workpiece according to the present invention.
Figure 12:
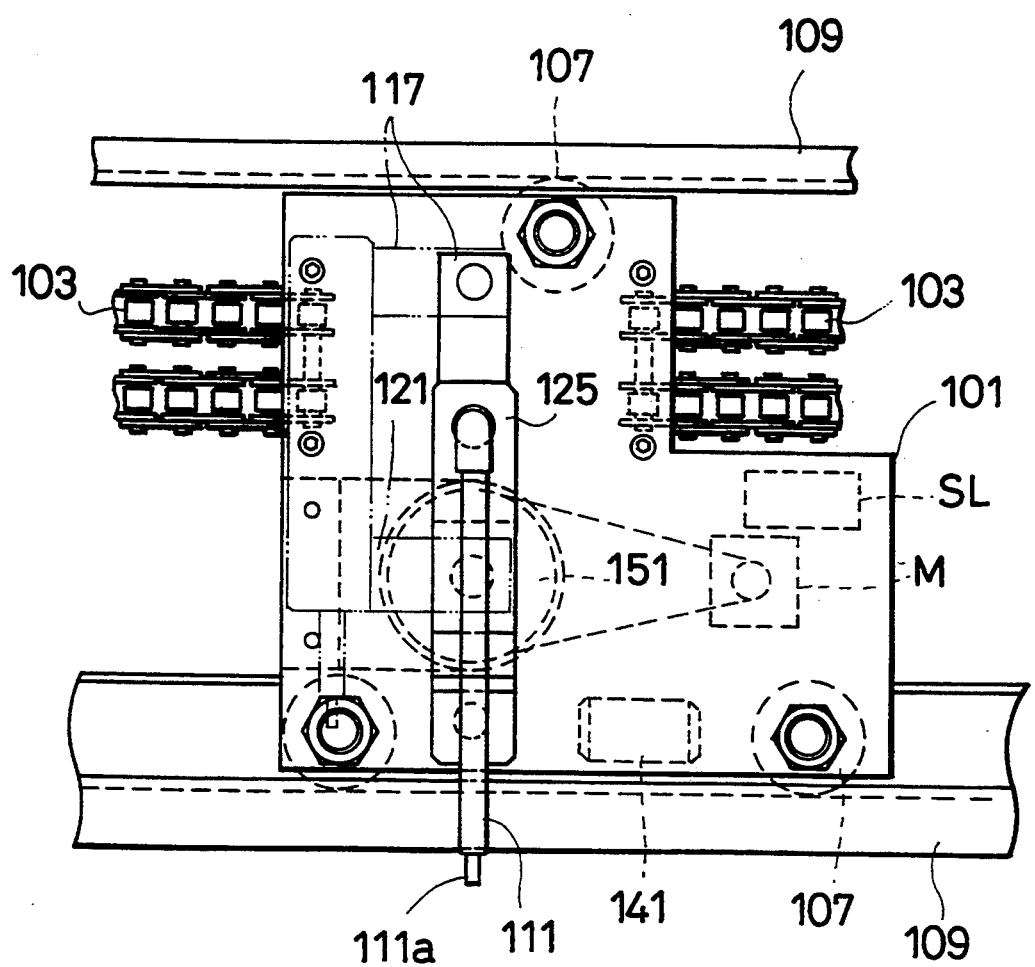
FIG. 12 is a schematic side view of the apparatus of FIG. 11.

Referring now to FIG. 11 to FIG. 13, a second embodiment of an apparatus for carrying a workpiece according to the present invention will be described in detail.

As shown in FIGS. 11 and 12, in this second embodiment, the apparatus 105 generally comprises: a pair of guide rails 109 forming a carrier passage; a plate shaped moving member 101 provided between upper and lower members of the guide rails 109 to be linearly movable on a horizontal plane along the guide rails 109 by means of rollers 107; and a chain 103 for driving the movable member 101 in a linear motion along the guide rails 109. The apparatus 105 can be equipped with a plurality of the moving members 101 similar to that shown in FIG. 12 along the carrier passage formed by the guide rails 109.

The moving member 101 is equipped with a workpiece holding member 111 having a suction nozzle 111a for holding the workpiece. The workpiece holding member 111 is capable of revolving on a vertical plane around a revolution axis displaced from a pivotal shaft 127 of the workpiece holding member 111, by means of a four-joint link mechanism 113 provided in the moving member 1.

The four-joint link mechanism 113 comprises: a first link 117 having its one end attached to one end of an upper rotational shaft 115; a second link 121 having its one end attached to one end of a lower rotational shaft 119; and a third link 125 for connecting the other ends of the first link 117 and the second link 121 to be freely rotatable together, where the other ends of the upper rotational shaft 115 and the lower rotational shaft 119 are supported to be freely rotatable by bearing members 123 provided on the moving member 101.

The linkage between the first link 117 and the third link 125 is made to be freely rotatable by the pivotal shaft 127 attached at a base portion of the workpiece holding member 111, while the linkage between the second link 121 and the third link 125 is made to be freely rotatable by a linkage pin 129, and the ratio of the lengths of the first link 117 and the second link 121 is set to be 1:1.

In this four-joint link mechanism 113, when the driving forces are supplied to the upper rotational shaft 115 and the lower rotational shaft 119, the workpiece holding member 111 revolves around the revolutional axis defined by the upper rotational shaft 115 while maintaining the suction nozzle 111a to be pointing downwards.

The upper rotational shaft 115 and the lower rotational shaft 119 are a transmission system for a differential gear control mechanism 131 to be described in detail below, where the upper and lower rotational shafts 115 and 119 are connected by a transmission belt 135 wound around pulleys 133 provided on the upper and lower rotational shafts 115 and 119.

The workpiece holding member 111 has the suction nozzle 111a at its tip end, the base portion attached with the pivotal shaft 127, and a middle portion fixedly supported by the third link 125 through a bracket 137. The suction nozzle 111a is connected with a vacuum pump 141 through a connection path 139 provided within the pivotal shaft 127, the first link 117, and the upper rotational shaft 115, and a pipe 143 provided between the upper rotational shaft 115 and the vacuum pump 141. The pipe 143 is equipped with a valve 145, such that the holding and releasing of the workpieces by the suction nozzle 111a can be controlled by controlling opening and closing of the valve 145.

The differential gear control mechanism 131 is a transmission system to which a driving force produced by a motor M provided on the moving member 101 and a driving force from a rack 147 provided along the guide rails 109 are entered simultaneously through a differential gear 149.

The differential gear 149 is what is generally known as a harmonic gear, which has two transmission mechanisms including a motor transmission mechanism for transmitting the driving force from the motor M to an input pulley 151, and a rack transmission mechanism For transmitting the driving force from the rack 147 to the lower rotational shaft 119 as a transmission gear 153 is rotated around itself by the rack 147 in response to the linear motion of the moving member 101.

The input pulley 151 is attached to a planetary gear 157 which rotates around a solar gear 155 while rotating around itself, where the planetary gear 157 is engaged between the solar gear 155 and a ring gear 159 which is fixed to the transmission gear 153 integrally.

Thus, while the motor M is off, as the moving member 101 linearly moves in a direction of an arrow A shown in FIG. 13, the transmission gear 153 engaged with the rack 147 rotates around itself, and the rotational driving force of the transmission gear 153 is transmitted to the lower rotational shaft 119 through the differential gear 149 as a rotational driving force in a counter-clockwise direction.

As a result of a combination of the planetary gear mechanism for the workpiece holding member 111 described above and the differential gear control mechanism 131, a tip of the suction nozzle Ilia repeats a pick up motion along a cycloidal trajectory N similar to that shown in FIG. 6 described above in conjunction with the first embodiment.

On the other hand, during this pick up motion of the suction nozzles 111a, the period L of the cycloidal trajectory N for the pick up motion can be adjusted, to be longer or shorter as desired, by rotating the input pulley 151 in the same direction as the linear motion of the moving member 101, using the driving force produced by the motor M.

More specifically, this adjustment of the period of the pick up motion can be made as follows. Namely, when the transmission gear 153 rotates once while the input pulley 151 is stopping, the rotation of the transmission gear 153 is transmitted through the planetary gear 157 to the solar gear 155 as a rotation in an opposite direction. At this point, by rotating the planetary gear 157 around the solar gear 155 in the same direction as the rotation of the transmission gear 153 by using the motor M, the suction nozzle 111a can be put in the pick up motion along the cycloidal trajectory N with the period L corresponding to the gear ratio of the transmission gear 153. In this pick up motion, the ratio of rotations is set to be such that the speed of the tip of the suction nozzle 111a due to the linear motion of the moving member 101 in the direction of an arrow A shown in FIG. 13 can be cancelled out by the speed of the tip of the suction nozzle 111a due to the revolutional motion of the workpiece holding member 111, so that the suction nozzle 111a holding the workpiece, which is maintained to be pointing downwards throughout the pick up motion, can make the stable pick up or releasing operation with respect to the workpiece as its tip has the speed with respect to the ground substantially equal to zero at the lowest position of the workpiece holding member 111 in the revolutional motion. Thus, by properly controlling the rotation of the planetary gear 157 around the solar gear 155 by using the motor M, the period L of the cycloidal trajectory N for the pick up motion can be adjusted appropriately.

Furthermore, by controlling the rotation of the planetary gear 157 around the solar gear 155 such that the rotation of the planetary gear 157 is completely synchronized with the rotation of the transmission gear 155, the workpiece holding member 111 can revolve around the revolution axis while maintaining its orientation.

This apparatus 105 of the second embodiment is further equipped with a control unit SL provided on the moving member 101, as shown in FIGS. 11 and 12. This control unit SL receives various input information from various sensors (not shown) provided in the apparatus 105 such as an image recognition sensor for confirming a state of holding of the workpiece by the suction nozzle 111a, a distance sensor for measuring a distance traveled by the moving member 101, etc. Using these various input information, the control unit SL outputs control signals for appropriately controlling opening and closing timing for the valve 145, and on and off timing for the motor M.

Now, an overall operation of this apparatus for carrying a workpiece of the second embodiment will be described.

Namely, the moving member 101 linearly moves continuously, and the workpiece holding member 111 continuously makes a revolutional motion around the revolution axis while maintaining the suction nozzle 111a to be pointing downwards. At this point, when the rotational driving force is supplied from the motor M to the input pulley 151 and the transmission gear 153 in the same direction, the suction nozzle 111a makes the pick up motion along the cycloidal trajectory N of the period L between the successive lowermost positions. In this pick up motion, the tip of the suction nozzle 111a has the speed with respect to the ground substantially equal to zero at the lowermost positions, so that the stable pick up or releasing operation can be obtained with respect to the workpiece at the ground level.

Here, in this pick up motion, no intermittent motion is involved so that there is no time loss in the workpiece carrying operation and a continuous workpiece carrying operation can be realized.

Moreover, by appropriately adjusting the period L of the cycloidal trajectory N for this pick up motion, the workpiece carrying operation involving any desired pick up and releasing positions can be realized, so that the efficiency of the workpiece carrying operation can be improved.

In addition, in this second embodiment, there is no need to impose any limitation on the carrier passage for carrying the workpiece.

Furthermore, the apparatus 105 of this second embodiment has a simpler structure by the use of a simple four-joint link mechanism.

It is to be noted that the vacuum suction at the suction nozzles 111a used in the embodiment described above for the purpose of holding the workpiece can be replaced by any other holding means such as those using electromagnets, fasteners, etc.

It is also to be noted that the guide rails 109 used in the embodiment described above for the purpose of guiding the moving member 101 along the desired carrier passage can be replaced by a built-in direction and speed control means provided on the moving member 101 itself for controlling the linear motion of the moving member 101.

It is also to be noted that the straight carrier passage used in the description of the first and second embodiments is only the most simple example of the carrier passage on the horizontal plane that can be used in the present invention, and the apparatus of the present invention is equally applicable to a complicatedly curved carrier passage on the horizontal plane or a loop shaped carrier passage on the horizontal plane. In addition, a plurality of the apparatuses of the present invention can be used in combination to cope with a more complicated workpiece carrying operation.

It is also to be noted that, besides those already mentioned above, many modifications and variations of the above embodiments may be made without departing from the novel and advantageous features of the present invention. Accordingly, all such modifications and variations are intended to be included within the scope of the appended claims.

What is claimed is:

1. An apparatus for carrying a workpiece, comprising:
    guide members forming a carrier passage;
    a moving member linearly movable in a horizontal plane along the guide members;
    a workpiece holding member, provided on the moving member, having at least one holder for holding the workpiece, and revolving in a vertical plane around an axis of revolution displaced from a center of the workpiece holding member while maintaining an orientation in which the holder holding the workpiece points downwards;
    a driving mechanism driving the workpiece holding member in a revolutional motion in the vertical plane around the axis of revolution, while maintaining the workpiece holding member in said orientation in which the holder holding the workpiece points downwards; and
    a control mechanism controlling the holder to sequentially carry out holding of the workpiece and releasing of the workpiece at lowest positions of the workpiece holding member in the revolutional motion.

2. The apparatus of claim 1, wherein the workpiece holding member includes:
    a plurality of holders respectively holding a workpiece; and
    a rotary head rotatable in the vertical plane about an axis through a center thereof, from which said plurality of holders are extending radially; and
    wherein the apparatus further comprises a rotary head driving mechanism driving the rotary head in a rotational motion about the axis through the center.

3. The apparatus of claim 2, wherein each of the holders is rotatable, and wherein the apparatus further comprises a holder driving mechanism driving each of the holders in a rotational motion about an axis through a center thereon.

4. The apparatus of claim 2, wherein said plurality of holders hold workpieces of different sizes, and wherein one of the holders which points downwards during the revolutional motion of the workpiece holding member is selected by the rotational motion of the rotary head about an axis through a center thereof.

5. The apparatus of claim 2, wherein the rotary head driving mechanism rotates the rotary head through a prescribed angle in one direction immediately after the holder which points downwards, picks up the workpiece at ground level, and rotates the rotary head through the prescribed angle in another direction opposite to said one direction immediately before said holder releases the workpiece at the ground level, such that the workpiece held by said holder is lowered to a level higher than the ground level at the lowest positions of the workpiece holding member in the revolutional motion.

6. The apparatus of claim 1, wherein the driving mechanism includes a mechanism controlled by the control mechanism which adjusts a period between successive ones of the lowest positions of the workpiece holding member in the revolutional motion.

7. The apparatus of claim 1, wherein the workpiece is carried along a cycloidal trajectory produced by a combination of a linear motion by the moving member and the revolutional motion by the workpiece holding member.

8. The apparatus of claim 1, wherein the driving mechanism comprises a planetary gear mechanism in which a driving force at a first pulley provided on a fixed shaft member driven by a motor provided on the moving member is transmitted to a second pulley provided on a movable shaft for revolving around the fixed shaft member and having the workpiece holding member attached thereto, by transmission belt connecting the first pulley with the second pulley.

9. The apparatus of claim 1, wherein the driving mechanism comprises a planetary gear mechanism in which a driving force at first gear provided on a fixed shaft member driven by a motor provided on the moving member is transmitted to a second gear provided on a movable shaft member which is engaged with a first gear, said second gear revolving around the fixed shaft member and having the workpiece holding member attached thereto.

10. The apparatus of claim 1, wherein the driving mechanism comprises a four-joint link mechanism formed by a first link having one end attached to a first rotational shaft member driven by a motor provided on the moving member, a second link having one end attached to a second rotational shaft member driven by the motor provided on the moving member, and a third link connecting other ends of the first and second links so as to be freely rotatable together and having the workpiece holding member attached thereto.

11. A method of carrying a workpiece, comprising the steps of:

holding the workpiece by at least one holder provided on a workpiece holding member;

driving a moving member, on which the workpiece holding member is provided, in a linear motion in a horizontal plane along a carrier passage formed by guide members;

controlling the workpiece holding member so as to maintain an orientation in which said at least one holder holding the workpiece points downwards;

driving the workpiece holding member in a revolutional motion on a vertical plane around an axis of revolution displaced from a center of the workpiece holding member, while the workpiece holding member maintains said orientation in which said at least one holder holding the workpiece points downwards; and controlling the holder so as to sequentially carry out holding of the workpiece and releasing of the workpiece at lowest positions of the workpiece holding member in the revolutional motion.

12. The method of claim 11, wherein said at least one holder comprises a plurality of holders respectively holding a plurality of workpieces and which comprises the step of driving a rotary head, which is provided on the workpiece holding member and rotatable in the vertical plane about an axis through a center thereof, and from which said plurality of holders for holding said plurality of workpieces extend radially, in a rotational motion about an axis through a center thereof such that a selected one of said plurality of holders is set to point downwards by the rotational motion of the rotary head.

13. The method of claim 12, further comprising which comprises the step of driving each of said plurality of holders in a rotational motion about an axis through the center thereof, so as to adjust an orientation of the workpieces held by the holders.

14. The method of claim 12, wherein said plurality of holders comprise holders respectively holding workpieces of different sizes, and wherein at the step of driving the rotary head in the rotational motion about the axis through a center thereof, one of the holders which points downwards during the revolutional motion of the workpiece holding member is selected by the rotational motion of the rotary head.

15. The method of claim 12, wherein during the step of driving the rotary head in the rotational motion, the rotary head is rotated for a prescribed angle in one direction immediately after the holder which points downwards picks up the workpiece at ground level, and the rotary head is rotated for the prescribed angle in another direction opposite to said one direction immediately before said the holder releases the workpiece at ground level, such that the workpiece held by said holder is lowered to a level higher than ground level at the lowest positions of the workpiece holding member in the revolutional motion.

16. The method of claim 11, which comprises, at the controlling step, adjusting a period between successive ones of the lowest positions of the workpiece holding member in the revolutional motion.

17. The method of claim 11, which comprises carrying the workpiece along a cycloidal trajectory produced by a combination of a linear motion by the moving member and the revolutional motion by the workpiece holding member.

18. The method of claim 11, which comprises, at the step of driving the workpiece holding member, using a planetary gear mechanism having a belt transmission in driving the workpiece holding member in the revolutional motion in the vertical plane around the revolution axis displaced from the center of the workpiece holding member, while maintaining the orientation of the workpiece holding member in which one of the holders holding the workpiece points downwards.

19. The method of claim 11, which comprises, using at the step of driving the workpiece holding member, a planetary gear mechanism having a gear transmission in driving the workpiece holding member in the revolutional motion in the vertical plane around the revolution axis displaced from the center of the workpiece holding member, while maintaining the orientation of the workpiece holding member in which one of the holders holding the workpiece points downwards.

20. The method of claim 11, which comprises using, at the step of driving the workpiece holding member, a four-joint link mechanism in driving the workpiece holding member in the revolutional motion in the vertical plane around the revolution axis displaced from the center of the workpiece holding member, while maintaining the orientation of the workpiece holding member in which one of the holders holding the workpiece points downwards.

* * * * *